(12) United States Patent
Defay et al.

(10) Patent No.: US 8,310,129 B2
(45) Date of Patent: Nov. 13, 2012

(54) ACOUSTIC RESONATOR COMPRISING AN ELECTRET AND METHOD OF PRODUCING SAID RESONATOR, APPLICATION TO SWITCHABLE COUPLED RESONATOR FILTERS

(75) Inventors: Emmanuel Defay, Voreppe (FR); Sebastien Boisseau, Grenoble (FR); Ghislain Despesse, Saint Egreve (FR); Brice Ivira, La Guerche sur l'Aubois (FR); Alexandre Reinhardt, Saint Martin d'Heres (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 21 days.

(21) Appl. No.: 12/975,974

(22) Filed: Dec. 22, 2010

(65) Prior Publication Data

US 2011/0248602 A1  Oct. 13, 2011

(30) Foreign Application Priority Data

Dec. 23, 2009  (FR) ...................................... 09 59510

(51) Int. Cl.
*H01L 41/08* (2006.01)
(52) U.S. Cl. ...................................................... 310/311
(58) Field of Classification Search .................. 310/311, 310/328, 317
See application file for complete search history.

(56) References Cited

U.S. PATENT DOCUMENTS

| | | | |
|---|---|---|---|
| 2,486,560 A | 11/1949 | Gray | |
| 3,118,022 A | 1/1964 | Sessler et al. | |
| 3,702,493 A | 11/1972 | Murphy | |
| 4,057,660 A | 11/1977 | Yoshida et al. | |
| 5,486,423 A | 1/1996 | Lewiner et al. | |
| 6,720,844 B1 | 4/2004 | Lakin | |
| 6,917,261 B2 | 7/2005 | Unterberger | |
| 6,928,178 B2 | 8/2005 | Chang | |
| 7,486,003 B1 | 2/2009 | Jang et al. | |
| 7,741,754 B1 | 6/2010 | Jang et al. | |
| 2003/0058065 A1 | 3/2003 | Abe et al. | |
| 2003/0067368 A1 | 4/2003 | Ohara et al. | |
| 2005/0012568 A1 | 1/2005 | Aigner et al. | |
| 2005/0206476 A1 | 9/2005 | Ella et al. | |
| 2007/0063793 A1 | 3/2007 | Jang et al. | |
| 2008/0104813 A1 | 5/2008 | Jang et al. | |
| 2008/0129416 A1 | 6/2008 | Volatier et al. | |

FOREIGN PATENT DOCUMENTS

| | | |
|---|---|---|
| DE | 1 245 441 | 3/1964 |
| EP | 0 608 162 B1 | 7/1994 |
| FR | 2 905 207 | 2/2008 |
| WO | 2005/046052 A1 | 5/2005 |

OTHER PUBLICATIONS

French Preliminary Search Report issued Sep. 7, 2010, in French Patent Application No. 0959510 with English translation of category of cited documents.

(Continued)

*Primary Examiner* — Mark Budd
(74) *Attorney, Agent, or Firm* — Oblon, Spivak, McClelland, Maier & Neustadt, L.L.P.

(57) ABSTRACT

Acoustic resonator comprising an electret, and method of producing said resonator, application to switchable coupled resonator filters.

The resonator comprises: at least one piezoelectric layer (30); electrodes (24, 26) on either side of this layer; and at least one electret layer (32) between the electrodes, to apply a permanent electric field to the piezoelectric layer. The intensity of this electric field is determined to shift the resonance frequency of the resonator by a desired value. The piezoelectric layer may contain electrical charges to itself constitute the electret layer.

15 Claims, 13 Drawing Sheets

OTHER PUBLICATIONS

Roman Lanz, "Piezoelectric thin films for bulk acoustic wave resonator applications: from processing to microwave filters", These EPFL, No. 2991, 2004, http://library.epfl.ch/epfl-theses/?nr=2991, 3 pages, Abstract and p. 64, full text available on the internet.

Jose A. Giacometti, et al., "Corona Charging of Polymers", IEEE Transactions on Electrical Insulation, vol. 27, No. 5, Oct. 1992, pp. 924-943.

Fabio Peano, et al., "Design and Optimization of a MEMS Electret-Based Capacitive Energy Scavenger", Journal of Microelectromechanical Systems, vol. 14, No. 3, Jun. 2005, pp. 429-435.

P. Gunther, "Charging, Long-term Stability, and TSD Measurements of $SiO_2$ Electrets", IEEE Transactions on Electrical Insulation, vol. 24, No. 3, Jun. 1989, pp. 439-442.

V. Leonov, et al., "Stabilization of Positive Charge in $SiO_2/Si_3/N_4$ Electrets", IEEE Transactions on Dielectrics and Electrical Insulation, vol. 13, No. 5, Oct. 2006, pp. 1049-1056.

A. Volatier, et al., "Design Elaboration and characterization of Coupled Resonator Filters for WCDMA applications", 2006 IEEE Ultrasonics Symposium, 2006, pp. 829-832.

Alexandre Volatier, et al., "Switchable and tunable strontium titanate electrostrictive bulk acoustic wave resonator integrated with a Bragg mirror", Applied Physics Letters, vol. 92, No. 3, 2008, pp. 032906-1 to 032906-3.

Kazuo Ikezaki, et al, "Thermally Stimulated Currents from Ion-Injected Teflon-FEP Film Electrets", Japanese Journal of Applied Physics, vol. 20, No. 9, Sep. 1981, pp. 1741-1747.

M. Bruel, "Silicon on Insulator material Technology", Electronics Letters, vol. 31, No. 14, Jul. 6, 1995, pp. 1201-1202.

L. Di Cioccio, et al., "Silicon Carbide on insulator formation by the Smart-Cut® process", Materials Science and Engineering, vol. B46, 1997, pp. 349-356.

E. Jalaguier, et al., "Transfer of 3in GaAs film on silicon substrate by proton implantation process", Electronics Letters, vol. 34, No. 4, Feb. 19, 1998, pp. 408-409.

E. Jalaguier, et al., "Transfer of thin InP films onto silicon substrate by proton implantation process", 11th International Conference on Indium Phosphide and Related Materials, May 16-20, 1999, pp. 26-27.

A. Tauzin, et al., "Transfers of 2-inch GaN films onto sapphire substrates using Smart Cut™ technology", Electronics Letters, vol. 41, No. 11, May 26, 2005, pp. 668-670.

C. Deguet, et al., "200 MM Germanium-On-Insulator (GEOI) Structures Realized From Epitaxial Wafers Using the Smart CUT™ Technology", Electrochemical Society Proceedings, vol. 2005-06, 2005, pp. 78-88.

W. E. Newell, "Face-Mounted Piezoelectric Resonators", Proceedings of the IEEE, Jun. 1965, pp. 575-581.

Kenneth M. Lakin, et al., "Development of Miniature Filters for Wireless Applications", IEEE Transactions on Microwave Theory and Techniques, vol. 43, No. 12, Dec. 1995, pp. 2933-2939.

K. M. Lakin, "Fundamental Properties of thin Film Resonators", Forty-fifth Annual Symposium on Frequency Control, 1991, pp. 201-206.

Marc-Alexandre Dubois, "Aluminium nitride and lead zirconate-titanate thin films for ultrasonic applications: Integration, properties and devices", These EPFL, No. 2086, 1999, http://library.epfl.ch/theses/?nr=2086, 1 page Abstract only, full text available on the internet.

A. A. Shirakawa, et al., "A High Isolation and High Selectivity Ladder-Lattice BAW-SMR Filter", 2006 European Microwave Conference, 2006, pp. 1405-1408.

G. R. Kline, et al., "Low Insertion Loss Filters Synthesized with Thin Film Resonators", 1987 IEEE Ultrasonics Symposium, 1987, pp. 375-380.

K. M. Lakin, "Coupled Resonator Filters", 2002 IEEE Ultrasonics Symposium, 2002, pp. 901-908.

G. G. Fattinger, et al., "Coupled Bulk Acoustic Wave Resonator Filters: Key Technology for single-to-balanced RF Filters", 2004 IEEE MTT-S Digest, 2004, pp. 927-929.

Wei Pang, et al., "Electrical Frequency Tuning of Film Bulk Acoustic Resonator", Journal of Microelectromechanical Systems, vol. 16, No. 6, Dec. 2007, pp. 1303-1313.

ACOUSTIC RESONATOR COMPRISING AN ELECTRET AND METHOD OF PRODUCING SAID RESONATOR, APPLICATION TO SWITCHABLE COUPLED RESONATOR FILTERS

TECHNICAL FIELD

The present invention relates to an acoustic resonator and a method of producing said resonator.

It applies in particular to the telecommunications field, and more particularly to mobile telephony.

STATE OF THE PRIOR ART

Numerous acoustic resonators are necessary in the field of mobile telephony, particularly for filtering and time reference devices. In these devices, SAW type (for Surface Acoustic Wave) or BAW type (for Bulk Acoustic Wave) acoustic resonators are currently used, which employ piezoelectric materials such as $LiNbO_3$, $LiTaO_3$ and AlN.

As shown schematically in FIG. 1, a BAW type resonator is typically constituted of three layers: a lower electrode 2, a piezoelectric layer 4 and an upper electrode 6. The resonance frequency of such a resonator is determined to the first order by the thickness of the piezoelectric layer 4.

According to telecommunications standards, the precision required for the determination of the resonance frequency is of the order of 0.1%. This signifies that the precision on the thickness of the piezoelectric layer must also attain this value.

It should however be noted that the thickness of the electrodes also intervenes in the value of the resonance frequency and that it is thus also indispensable to control their thickness properly.

However, the deposition techniques (in particular cathodic sputtering), which are traditionally used to form the layers of piezoelectric materials (particularly AlN, which is by far the material the most widely used for BAW type resonators) or the electrodes, make it possible to attain at best a precision of 1% on wafers of 200 mm diameter.

Thus, to attain a high output on such wafers, it is indispensable to provide for a step of trimming of the resonance frequency. During this step, the localised etching is carried out of a load that has been deposited beforehand on each resonator; it involves typically a layer of $SiO_2$ or SiN or even the upper electrode itself.

A first measurement of the resonance frequency is carried out after the deposition of this load.

Thanks to specific equipment, a defined thickness of the layer that loads the resonator is then etched locally in order to re-trim the resonance frequency to the desired frequency.

This trimming step makes it possible to considerably increase the production output of the wafers.

However, it requires specific equipment for localised etching, which is costly and very delicate to control and the maintenance of which is difficult.

To change the resonance frequency of a BAW type resonator, it is also possible to apply to the latter a direct voltage, in addition to the radiofrequency signal which is used for its operation.

Indeed, it has been shown that piezoelectric materials, in particular AlN, show a drift of their resonance frequency with such a direct voltage.

The physical phenomenon associated with this drift is a variation in the stiffness of the AlN as a function of the direct voltage, variation that itself brings about a variation in the acoustic velocity and thus in the resonance frequency.

In this respect, reference may be made to the thesis of Roman Lanz, Piezoelectric Thin Films for Bulk Acoustic Wave Resonator Applications: From Processing to Microwave Filters, thesis presented at l'Ecole Polytechnique Fédérale de Lausanne (2004).

More specifically, reference may be made to page 64 of this document where the variation mentioned above is represented.

The typical value of the variation observed is equal to 72 ppm/V for an AlN layer 380 nm thick, the antiresonance frequency of which is of the order of 8 GHz.

This signifies that the application of a voltage of +70V to this AlN layer induces a variation of the antiresonance frequency of +0.5%. Moreover, the application of a voltage of −70V induces a variation of this frequency of −0.50.

Furthermore, AlN has a breakdown field of the order of 5 MV/cm. Consequently, for a thickness of 380 nm, its breakdown voltage is of the order of 190 V. Thus, the application of +70 V or −70 V to 380 nm of AlN does not cause the breakdown of the material and induces a variation of 1% (or +/−0.5%) of the antiresonance frequency.

It should be noted that the variations in the resonance and antiresonance frequencies are virtually identical in the AlN when a direct voltage is applied.

Thus, the application of a direct voltage is one solution to trim the characteristic frequencies of a resonator, for the applications of the latter to telecommunications, with a view to compensating the variations of thickness which are of the order of 1%.

However, this solution is not applicable in the case of a mobile telephone. Indeed, the voltage of the battery of the latter is only of the order of a few volts (typically 3 V) whereas a hundred or so volts would be needed as has been seen above.

DESCRIPTION OF THE INVENTION

The aim of the present invention is to overcome the drawbacks of the known solutions, mentioned above.

According to the invention, to shift the resonance frequency of an acoustic resonator, comprising a layer of piezoelectric material, an electret is added to the latter. This electret applies a permanent and constant electric field to the layer.

This electric field shifts the resonance frequency of the resonator. More specifically, the intensity of this electric field is determined to shift the resonance frequency by a desired value.

It will be recalled that an electret makes it possible to apply a continuous electric field without electrical supply, in the same way that a magnet applies a permanent magnetic field without permanent external supply.

Such an electret is obtained by charging a thin film of a dielectric material, such as silica or silicon nitride, by implanting electric charges (electrons or holes) therein by a technique such as Corona discharge, electron implantation or ion implantation.

The intensity of the electric field resulting from this implantation is a function of the quantity of implanted electrical charges.

The object of the present invention is in particular an acoustic resonator, comprising:
  at least one piezoelectric layer,
  first and second electrodes on either side of the piezoelectric layer, and
  at least one electret layer between the first and second electrodes, to apply a permanent electric field to the piezoelectric layer, characterised in that the intensity of this electric field is determined to shift the resonance frequency of the resonator by a desired value.

According to a particular embodiment of the acoustic resonator, object of the invention, the piezoelectric layer or layers having respectively electromechanical properties, said electret layer comprises permanent electrical charges, making it possible to modify said electromechanical properties.

Electromechanical properties of a layer is taken to mean in particular the electromechanical coupling of said layer, its dielectric constant and its stiffness.

The electret layer may be made of piezoelectric material. In this case, the electret layer is merged with the piezoelectric layer or is formed by a separate layer.

The thickness of the electret layer may be chosen from a few nanometers to a few tens of micrometers; preferably, it is less than or equal to around 1 µm.

The acoustic resonator, object of the invention, may further comprise a substrate on one face of which is arranged one of the electrodes.

It is pointed out that, whatever the thickness of the stack formed by the piezoelectric layer and the electret layer, this resonator may comprise a substrate. In addition, the electrode mentioned above may be arranged on the substrate either directly, or through the intermediary of an intermediate layer.

The piezoelectric layer may contain electrical charges to constitute itself the electret layer.

The electret layer may be separate from the piezoelectric layer or layers.

In this case, according to a first particular embodiment, the electret layer lies between the piezoelectric layer and one of the first and second electrodes.

In the same case, according to a second particular embodiment, the acoustic resonator comprises first and second piezoelectric layers and the electret layer lies between the first and second piezoelectric layers.

According to a first particular embodiment of the invention, the substrate is provided with a cavity, or hole, which opens out at least onto one face of the substrate, and one first and second electrodes lie on this face of the substrate, above the cavity.

This hole may be a through hole or not.

According to a second particular embodiment of the invention, the acoustic resonator further comprises an acoustic Bragg grating, arranged between the substrate and one of the first and second electrodes.

In the invention, the electret layer may be crystalline or, quite the opposite, amorphous.

The present invention also relates to a switchable coupled resonator filter, comprising acoustic resonators which are acoustically coupled to each other, and in which one at least of the acoustic resonators is the acoustic resonator, object of the invention.

The present invention moreover relates to a method of producing an acoustic resonator, comprising:
  the formation of at least one piezoelectric layer,
  the formation of first and second electrodes on either side of the piezoelectric layer, and
  the formation of at least one electret layer between the first and second electrodes, to apply a continuous and permanent electric field to the piezoelectric layer,
in which the intensity of this electric field is determined to shift the resonance frequency of the resonator by a desired value.

According to a first particular embodiment, the method object of the invention comprises, beginning with a substrate provided with the first electrode and a sacrificial layer at one face of the substrate, the first electrode lying on this face of the substrate, above the sacrificial layer:
  the formation of a structure on the first electrode, the structure being chosen from:
    a layer suited to constituting both the piezoelectric layer and the electret layer,
    a set comprising the piezoelectric layer and a layer suited to constituting the electret layer, and
    a set comprising first and second piezoelectric layers and a layer suited to constituting the electret layer, between the first and second piezoelectric layers,
  the formation of the second electrode,
  the permanent electrical charging of the layer suited to constituting the electret layer, and
  the elimination of all or part of the sacrificial layer.

According to a second particular embodiment, the method object of the invention comprises:
  the formation of an acoustic Bragg grating on a substrate,
  the formation of the first electrode on the acoustic Bragg grating,
  the formation of a structure on the first electrode, the structure being chosen from:
    a layer suited to constituting both the piezoelectric layer and the electret layer,
    a set comprising the piezoelectric layer and a layer suited to constituting the electret layer, and
    a set comprising first and second piezoelectric layers and a layer suited to constituting the electret layer, between the first and second piezoelectric layers,
  the formation of the second electrode, and
  the permanent electrical charging of the layer suited to constituting the electret layer.

It is pointed out that in this method, including in its two previous embodiments, the order of the steps may be modified.

The permanent electrical charging of the layer suited to constituting the electret layer may be carried out by a method chosen from ion implantation and/or electron implantation and/or Corona discharge.

As a variant, the permanent electrical charging of the layer suited to constituting the electret layer is carried out by a method chosen from ion implantation and/or electron implantation and/or Corona discharge and/or the damp electrode method; the permanent electrical charging is then carried out before the formation of the second electrode.

According to a particular embodiment of the method object of the invention, for one or more piezoelectric layers forming a stack having a resonance frequency, the permanent electrical charges, introduced into the layer suited to constituting the electret layer, are such that they make it possible to obtain a determined or chosen shift, of the resonance frequency of the stack, which makes it possible to trim the frequency of the resonator.

BRIEF DESCRIPTION OF DRAWINGS

The present invention will be better understood on reading the description of embodiment examples given hereafter, by way of indication and in no way limiting, and by referring to the appended drawings in which.

DETAILED DESCRIPTION OF SPECIFIC EMBODIMENTS

Mention is made hereafter of the implementation of a Corona discharge.

In this respect, reference may be made for example to the article of J. A. Giacometti et al., Corona Charging of Polymers, IEEE Transactions on Electrical Insulation, vol. 27, no 5, October 1992.

Figure 1:
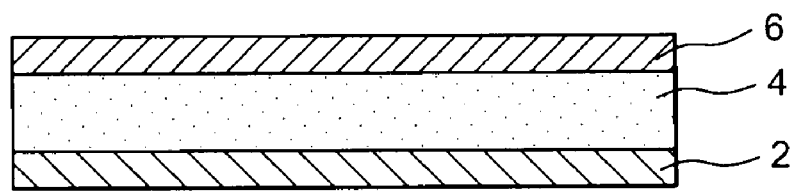
FIG. 1 is a schematic view of a typical stack for a volume wave resonator (of BAW type) and has already been described.
Figure 2:
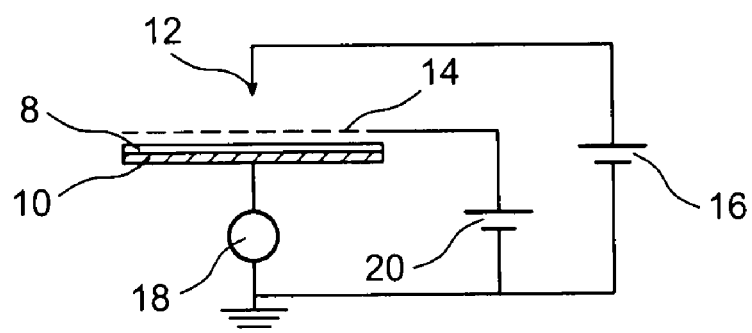
FIG. 2 is a schematic view of a Corona discharge (triode) device, of point-grid type.

FIG. 2 schematically illustrates a triode type (electrode-point-grid) Corona discharge device.

To use this technique, the sample 8, in which it is wished to implant charges, lies on an electrode 10 which is grounded.

A point-shaped electrode 12 is placed above the sample 8. A grid 14 is arranged between the electrode 10 and the sample 8.

The discharge is obtained by taking the electrode 10 to a positive potential, by means of an appropriate voltage source 16. As may be seen in FIG. 2, the discharge current is measured by an ammeter 18 and controlled by regulating the potential of the grid 14 by means of an appropriate voltage source 20.

Corona discharge will be returned to at the end of the present description.

Another technique used in the present invention is electron implantation. In this respect, reference may be made for example to the patent EP 0 608 162.

Electrets are used in certain microsystems, particularly for producing microphones (see for example the U.S. Pat. No. 6,928,178) and for producing certain energy recovery systems (see for example the article of Fabio Peano et al., Design and optimisation of a MEMS electret-based capacitive energy scavenger, J. of Electromechanical systems, vol. 14 (3), 2005).

In the prior art, the electret is used for its induced piezoelectricity properties.

Within the scope of the present invention, it is only used for its electric field that remains constant over time and which exists in the absence of any direct voltage, applied in a perpetual manner.

Figure 3:
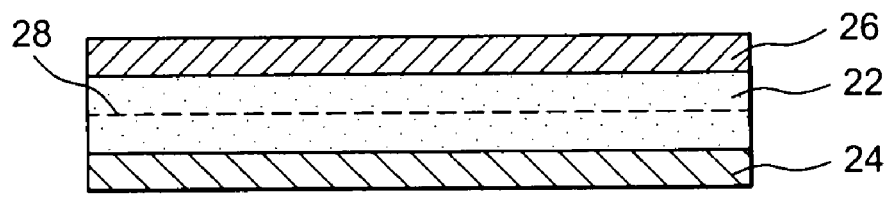
FIG. 3 is a schematic view of a structure that may be used in the invention and in which a piezoelectric layer also serves as electret layer.

FIG. 3 is a schematic sectional view of a first structure that may be used in an acoustic resonator according to the invention. This structure comprises a resonant layer 22 between two electrodes 24 and 26 which are for example both made of molybdenum.

In this structure, the resonant layer 22 is made of a piezoelectric material, for example AlN, ZnO or $Pb(Zr,Ti)O_3$.

Moreover, it itself serves as electret layer and, to that end, electrical charges 28 are implanted in it.

An electric field is thus applied permanently to the resonant layer 22. As has been seen above, the intensity of this electric field is determined to shift the resonance frequency of the resonator by a desired value.

As a variant, the resonant layer is made of an electrostrictive material (in other words a dielectric material that is not piezoelectric), for example $(Ba,Sr)TiO_3$, $SrTiO_3$, $Pb(Mg,Nb)TiO_3$, or $(Pb,La)(Zr,Ti)O_3$; and it again serves as electret layer, the electrical charges being implanted therein to this end.

To use the acoustic resonator which comprises the structure represented in FIG. 3, a radiofrequency signal is applied to one of the two electrodes, whereas the other electrode is grounded.

The same holds for the acoustic resonators described hereafter.

Figure 4A:
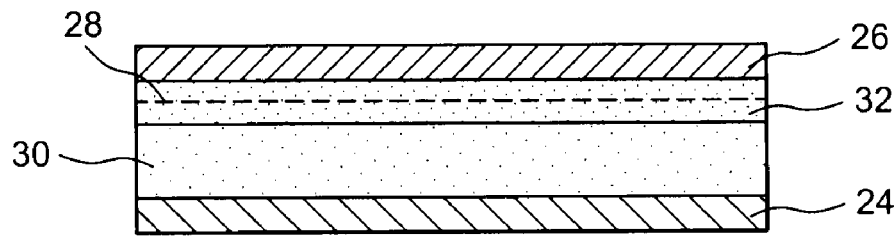
FIGS. 4A and 4B are schematic views of other structures that may be used in the invention and in which the piezoelectric layer and the electret are dissociated.

FIG. 4A is a schematic sectional view of a second structure that may be used in an acoustic resonator according to the invention.

This structure comprises two layers separate from each other between the electrode 24 (lower electrode) and the electrode 26 (upper electrode), namely a resonant layer 30 and an electret layer 32.

The latter lies between the resonant layer 30 and the upper electrode 26.

Figure 4B:
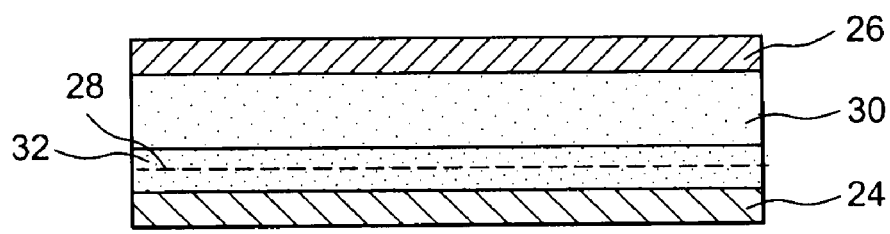

In the variant represented in FIG. 4B, on the contrary, it lies between the resonant layer 30 and the lower electrode 24.

In the structure (FIG. 4A or 4B), the layer 30 is made of a piezoelectric material, for example AlN, ZnO or $Pb(Zr,Ti)O_3$.

It is also possible to use an electrostrictive material, for example $(Ba,Sr)TiO_3$, $SrTiO_3$, $Pb(Mg,Nb)TiO_3$ or $(Pb,La)(Zr,Ti)O_3$.

The electret layer may be made, for its part, of any dielectric capable of conserving the charges 28 that have been implanted therein, for example $SiO_2$, SiN, a polymer (PTFE or parylene for example), or $Al_2O_3$.

Figure 5:
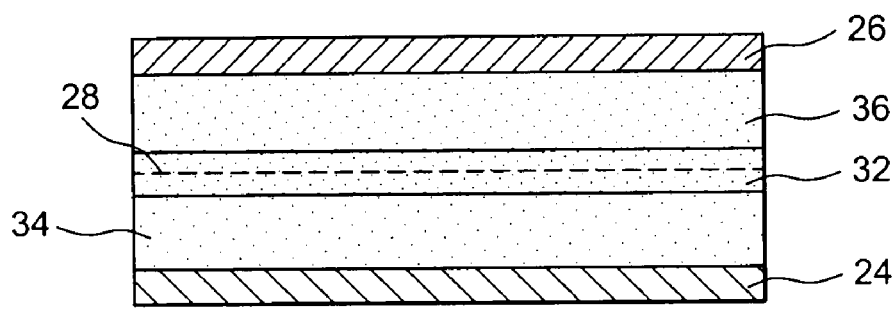
FIG. 5 is a schematic view of another structure that may be used in the invention and in which the electret lies between two piezoelectric layers, FIGS. 6A to 6L schematically illustrate a first particular embodiment of the method, object of the invention, FIGS. 7A to 7H schematically illustrate a second particular embodiment of the method, object of the invention, FIGS. 8A and 8B schematically illustrate a third particular embodiment of the method, object of the invention, FIG. 9 schematically illustrates a fourth particular embodiment of the method, object of the invention, FIGS. 10A and 10B schematically illustrate a fifth particular embodiment of the method, object of the invention.

FIG. 5 is a schematic sectional view of a third structure that may be used in an acoustic resonator, according to the invention.

It involves a variant of FIGS. 4A and 4B, in which the electret layer 32, provided with electrical charges 28, lies between two resonant layers 34 and 36.

Each of said resonant layers may again be made of a piezoelectric material or an electrostrictive material.

The set of layers 32, 34 and 36 again lies between the electrodes 24 and 26 as is seen in the figure.

The fact of placing the electret layer 32 between the resonant layers 34 and 36 makes it possible to increase the electret effect, in other words to increase the intensity of the electric field that is applied to the piezoelectric or electrostrictive material by the electret.

Various examples of the method of producing an acoustic resonator according to the invention are given hereafter.

To obtain the electret, there are two possibilities:

implanting the electrical charges in the piezoelectric layer (the case of the electrostrictive layer will be considered hereafter), implanting these charges in an additional layer, for example a $SiO_2$ layer, which may also enable a thermal compensation.

The first example relates to the production of an FBAR (for Film Bulk Acoustic Resonator) type acoustic resonator, the piezoelectric material of which is aluminium nitride (AlN).

The various steps of the production method are detailed hereafter.

Figure 6A:
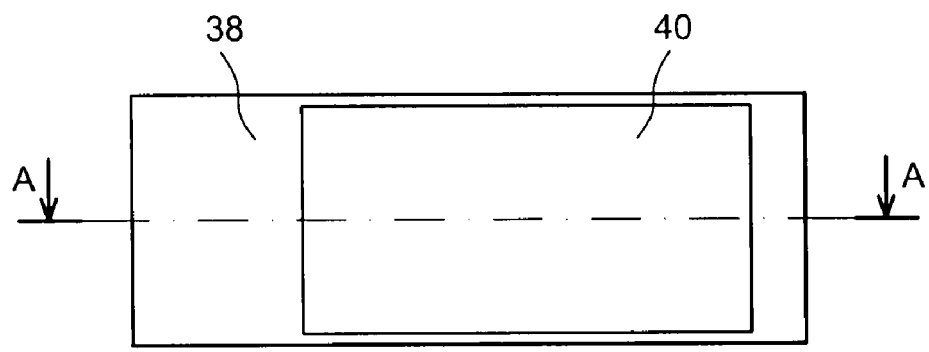
Figure 6B:
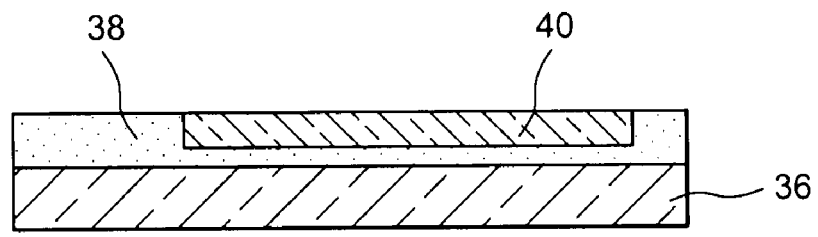

Beginning with a silicon substrate 36, of 200 mm diameter and 700 μm typical thickness (see FIG. 6A, which is a top view of the resonator during production and FIG. 6B, which is section AA of FIG. 6A).

A $SiO_2$ layer 38 is deposited, 2 μm thick, by PECVD at 770° C.

By a first lithography, the caisson of the cavity for releasing the final "membrane", in other words the finally formed resonator, is defined.

An etching of 1 μm of the $SiO_2$ is carried out by dry etching ($CHF_3/O_2$).

The resist having served for the etching is removed.

2 μm of polysilicon are deposited by CVD.

A chemical mechanical polishing (CMP) of the polysilicon is carried out with stoppage on the $SiO_2$, to obtain a polysilicon caisson 40, 1 μm thick.

Figure 6C:
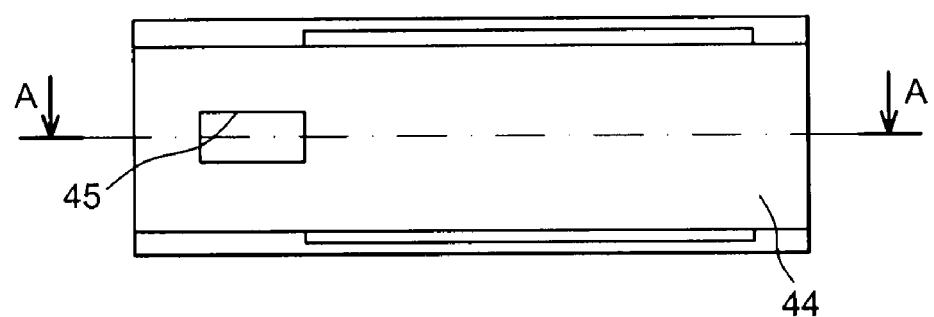
Figure 6D:
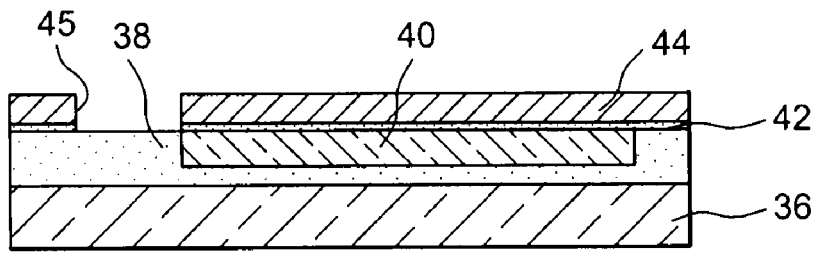

An AlN seed layer 42 is deposited, 20 nm thick (to improve the crystalline orientation of the lower electrode to be formed), by cathodic sputtering (see FIG. 6C: top view; and FIG. 6D: section AA of FIG. 6C).

A layer of lower platinum electrode is deposited, 200 nm thick, by cathodic sputtering.

By a second lithography, the lower electrode 44 is defined.

The lower electrode 44 and the seed layer 42 are etched by ion machining. The etched zone has the reference 45.

The resist having served for this etching is removed.

Figure 6E:
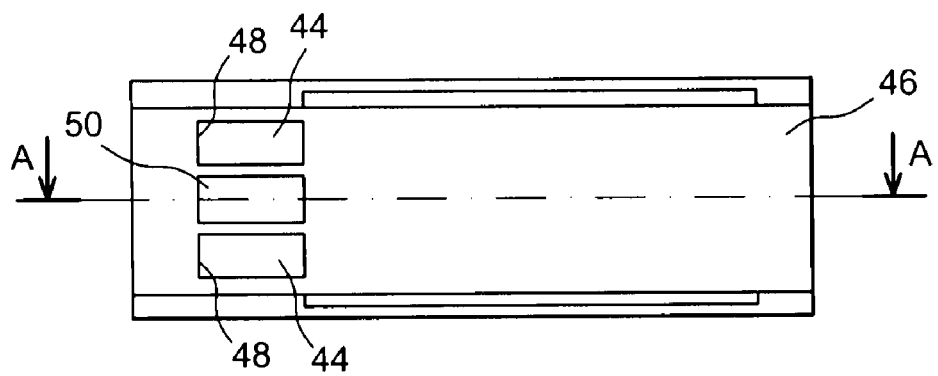
Figure 6F:
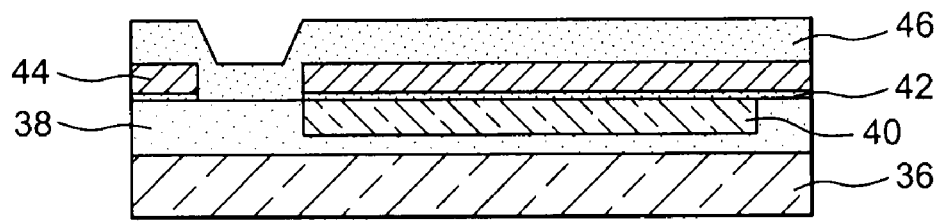

A layer of piezoelectric material 46 is deposited, namely 1 μm of AlN, by cathodic sputtering (see FIG. 6E: top view; and FIG. 6F: section AA of FIG. 6E).

A third lithography is carried out to define two contact zones 48 of the lower electrode 44. Reference 50 represents the zone where AlN is in contact with $SiO_2$.

A chemical etching of the AlN is carried out by $H_3PO_4$ at 130° C.

The resist having served for this etching is removed.

Figure 6G:
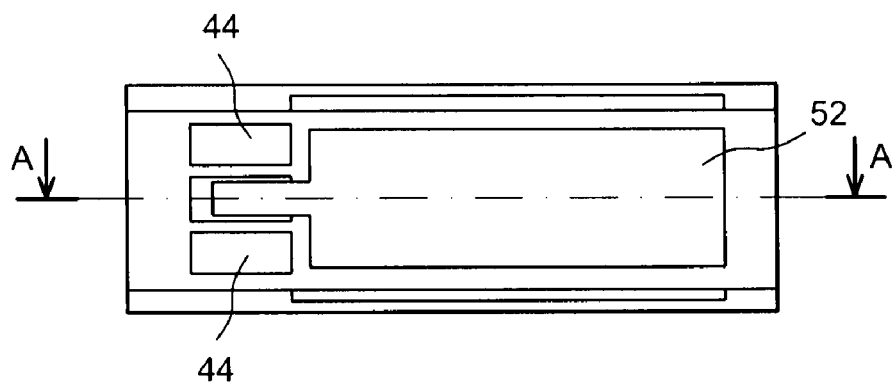
Figure 6H:
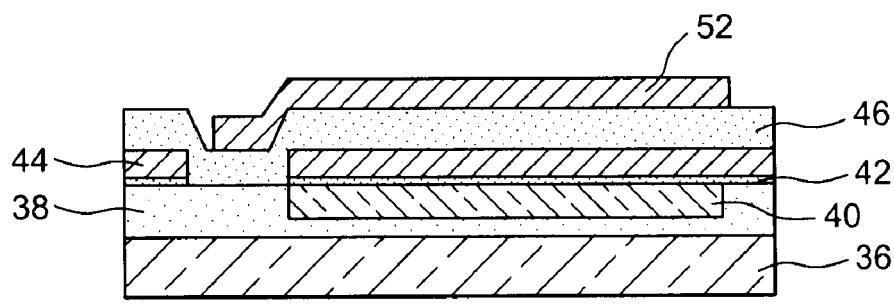

A layer of upper platinum electrode is deposited, 200 nm thick, by cathodic sputtering (FIG. 6G: top view; FIG. 6H: section AA of FIG. 6G).

By a fourth lithography, the upper electrode 52 is defined.

A dry etching of the platinum of the upper electrode is carried out by ion machining, in order to define the pattern of the upper electrode.

The resist having served for this etching is removed.

Figure 6I:
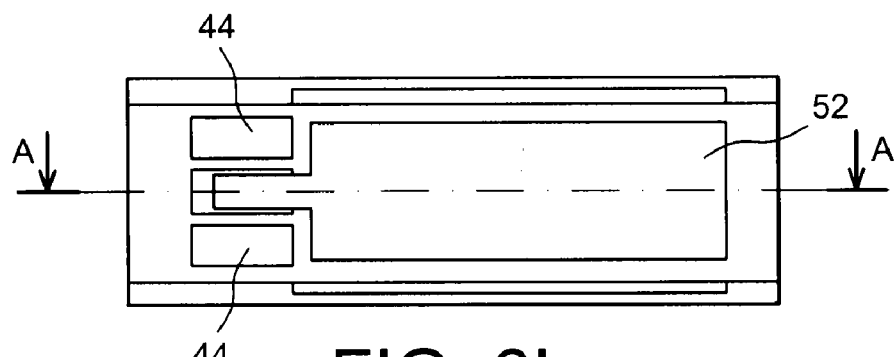
Figure 6J:
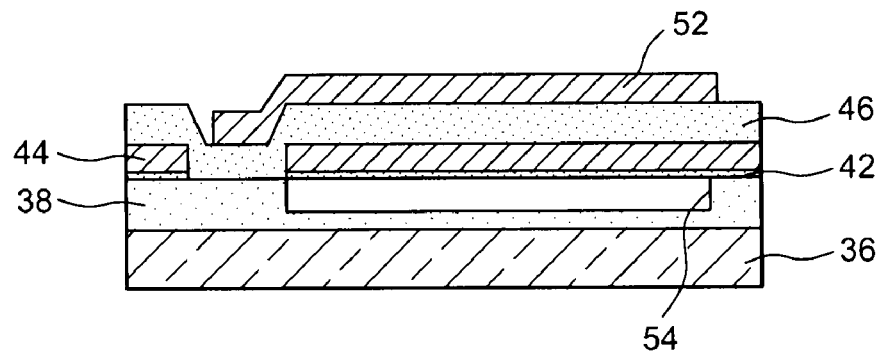

A dry etching is carried out by $XeF_2$ of the polysilicon 40 (FIG. 6I: top view; FIG. 6J: section AA of FIG. 6I).

A cavity 54 is thus formed under the resonator and releases it. The release of the membrane constituted by the resonator may also be obtained by an etching of the silicon substrate 36, from the rear face of said substrate. It then involves a deep etching in this substrate.

Figure 6K:
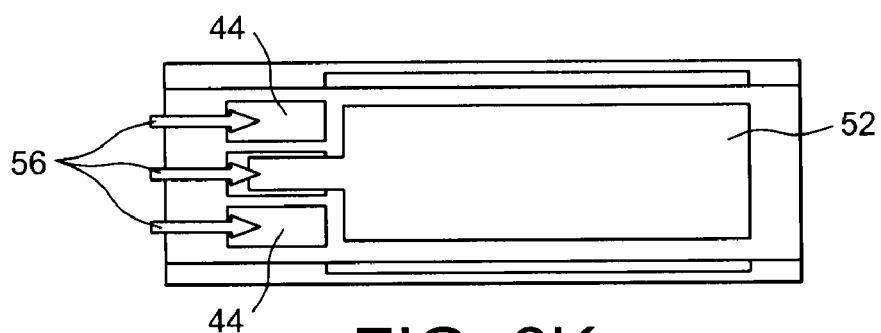

The characteristic frequencies of the resonator are measured by means of a network analyser (not represented). The arrows 56 of FIG. 6K (top view of the resonator) represent the connections of the analyser to the lower electrode 44 and to the upper electrode 52 for the measurement.

Figure 6L:
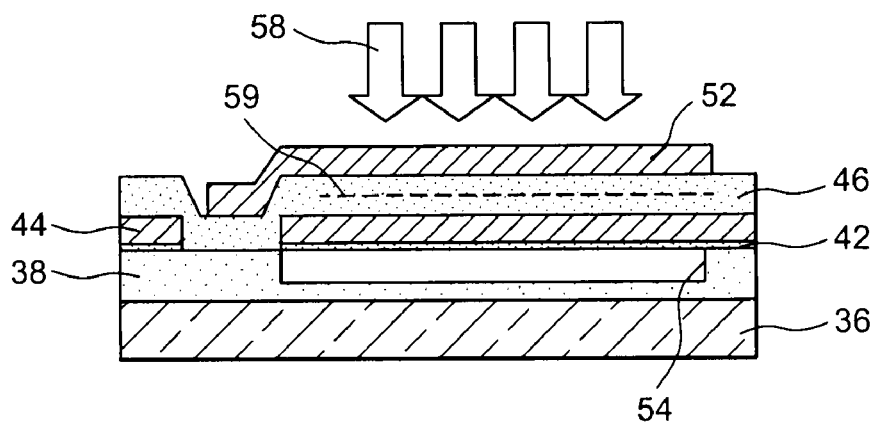

The charging of the resonator (see FIG. 6L: sectional view) is carried out by means of an electron or ion implantation (the arrows 58 symbolise the injection of the charges, which may be positive or negative), with a sufficient energy to pass through the metal layer, constituted of the upper electrode 52 (Corona discharge would not make it possible to pass through the latter). The implanted charges have the reference 59. The charge chosen corresponds to that which makes it possible to reset the resonator to the right frequency, given that the antiresonance frequency coefficient of variation of AlN as a function of the continuous electric field is equal to 0.25 Hz·m/V according to the thesis of R. Lanz, mentioned above.

The resonator defined by the stack that has been formed has a resonance frequency of 1.870 GHz and an antiresonance frequency of 1.918 GHz before the application of the electrical charge.

After the application of a charge corresponding to a potential of +100 V, the antiresonance frequency is equal to 1.943 GHz, from which follows a relative frequency variation of +1.3%.

The second example is identical to the first, except that Corona discharge is used to charge the dielectric (AlN layer). The charging of the latter is then carried out before the deposition of the upper electrode.

There is thus no measurement of the characteristic frequencies before having charged the AlN layer. It is thus not known how many charges have to be put into this layer.

However, the voltage may be adjusted by making the charges migrate in the dielectric, by heating the resonator after having deposited the upper electrode, and thus after having been able to measure the characteristic frequencies. The heating of the resonator can be carried out typically between 20° C. and 700° C., for example by means of an oven or a localised heating (for example by means of a laser).

The various steps of the method corresponding to the second example are given hereafter.

The references used in the first example have been conserved to designate the same parts.

Figure 7A:
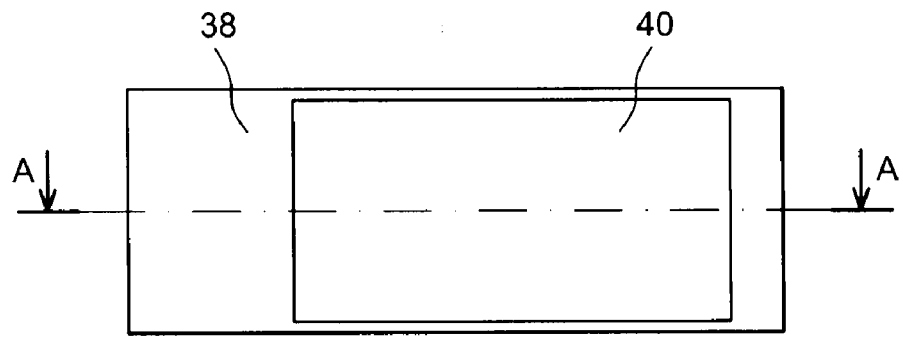
Figure 7B:
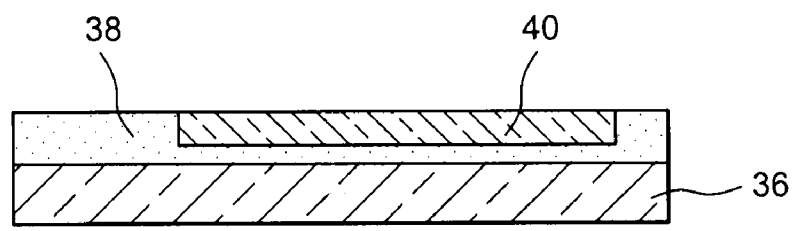

Beginning with the silicon substrate 36 of 200 mm diameter, of 700 μm typical thickness (FIG. 7A: top view of the resonator during production; FIG. 7B: section AA of FIG. 7A).

The $SiO_2$ layer 38, 2 μm thick, is deposited by PECVD at 770° C.

By a first lithography, the caisson of the release cavity of the final membrane is defined.

1 μm of the $SiO_2$ layer 38 is etched by dry etching ($CHF_3/O_2$).

The resist having served for this etching is removed.

2 μm of polysilicon is deposited by CVD.

A chemical-mechanical polishing (CMP) is carried out with stoppage on $SiO_2$, to obtain the polysilicon caisson 40, 1 μm thick.

Figure 7C:
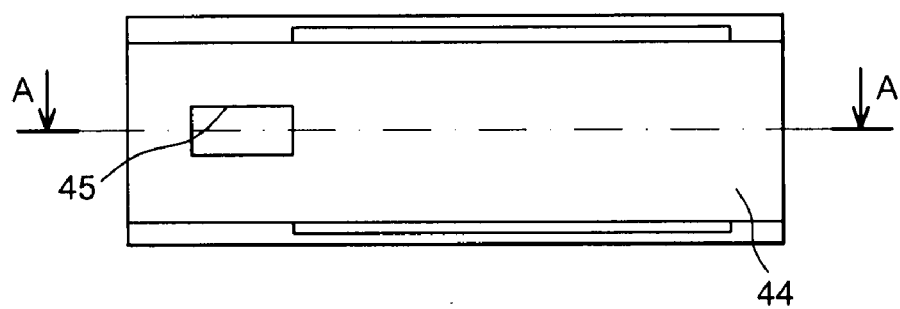
Figure 7D:
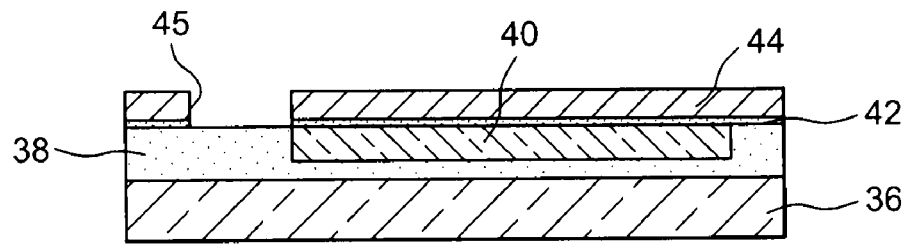

The AlN seed layer 42, 20 nm thick (to improve the crystalline orientation of the lower electrode to be formed), is deposited by cathodic sputtering (FIG. 7C: top view; FIG. 7D: section AA of FIG. 7C).

The lower platinum electrode 44, 200 nm thick, is deposited by cathodic sputtering.

By a second lithography, this lower electrode is defined.

The etching of the lower electrode 44 and the seed layer 42 is carried out by ion machining. The etched zone has the reference 45.

The resist having served for this etching is removed.

Figure 7E:
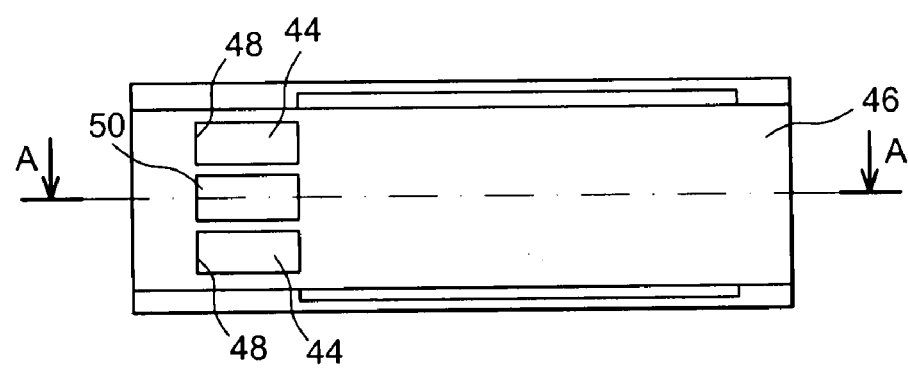
Figure 7F:
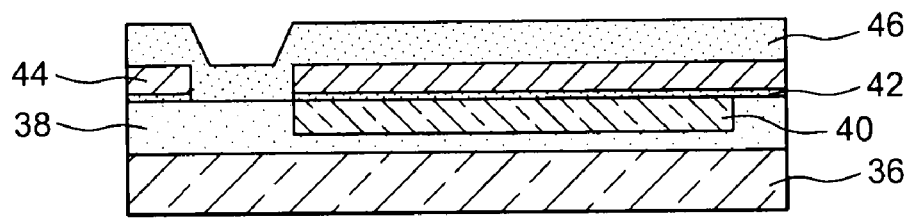

The piezoelectric AlN layer 46, 1 μm thick, is deposited by cathodic sputtering (FIG. 7E: top view; FIG. 7F: section AA of FIG. 7E).

By a third lithography, two contact zones 48 of the lower electrode 44 are defined. The reference 50 represents the zone where AlN is in contact with $SiO_2$.

A chemical etching of the AlN is carried out with $H_3PO_4$ at 130° C.

The resist having served for this etching is removed.

Figure 7G:
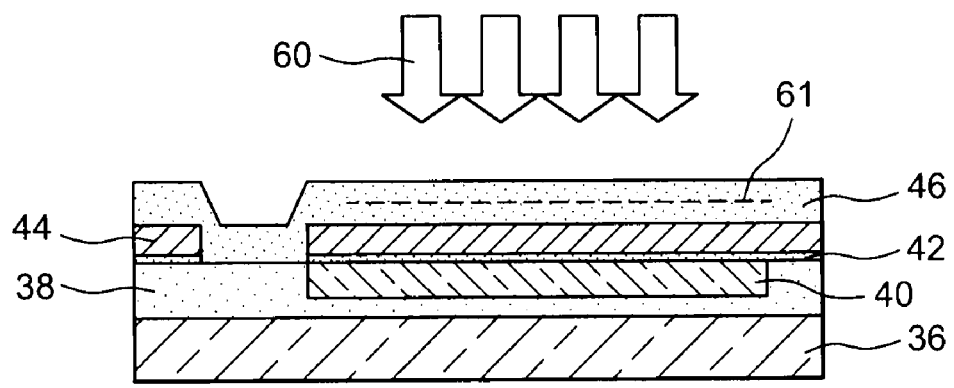

By the Corona discharge technique, electrical charges are injected (which may be positive or negative in the dielectric (AlN). A voltage of the order of 100 V is chosen for this injection. The injection of charges is symbolised by the arrows 60 in FIG. 7G (sectional view). The implanted electrical charges have the reference 61.

Figure 7H:
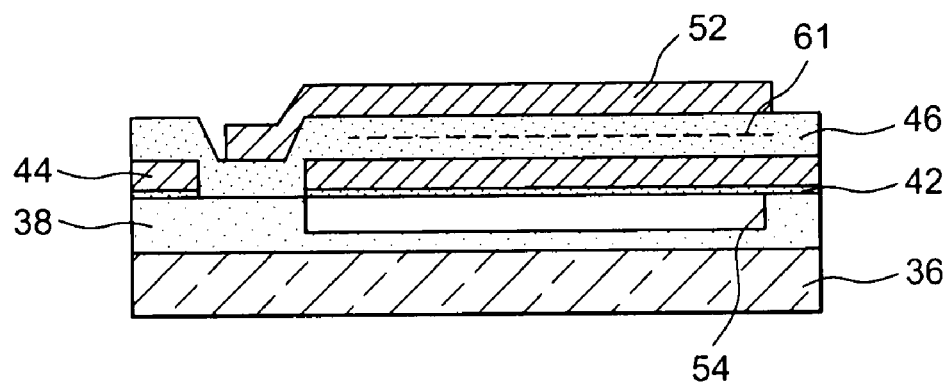

A layer of upper platinum electrode, 200 nm thick, is deposited by cathodic sputtering (FIG. 7H: sectional view).

By a fourth lithography, the upper electrode 52 is defined.

A dry etching of this upper electrode is carried out by ion machining.

The resist having served for this etching is removed.

A dry etching, with $XeF_2$, of the polysilicon 40 is carried out.

The cavity 54 thus forms under the resonator and releases it. The release of the membrane constituted by this resonator may also be obtained by etching of the silicon substrate 36, from the rear face of said substrate. It then involves a deep etching in this substrate.

The characteristic frequencies of the resonator are measured by means of a network analyser (not represented).

The frequencies are trimmed by heating the resonator. This heating makes it possible to make charges migrate in the dielectric (AlN layer) and thus to make the direct voltage, sustained by the dielectric, vary.

It should be noted that in this second example, nothing prevents an ion or electron implantation being used instead of Corona discharge.

Figure 8A:
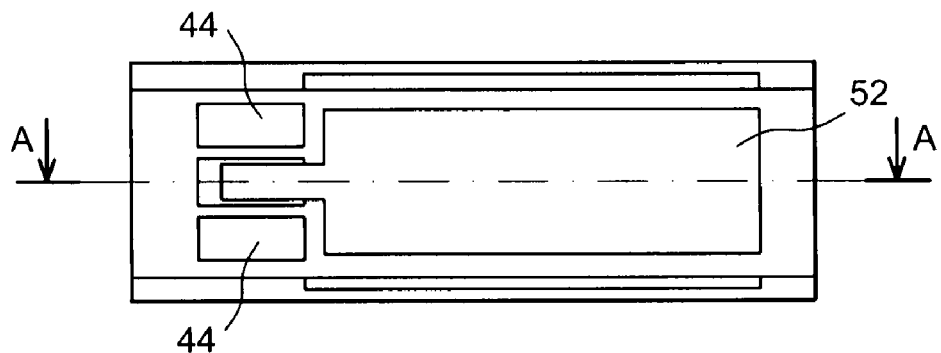
Figure 8B:
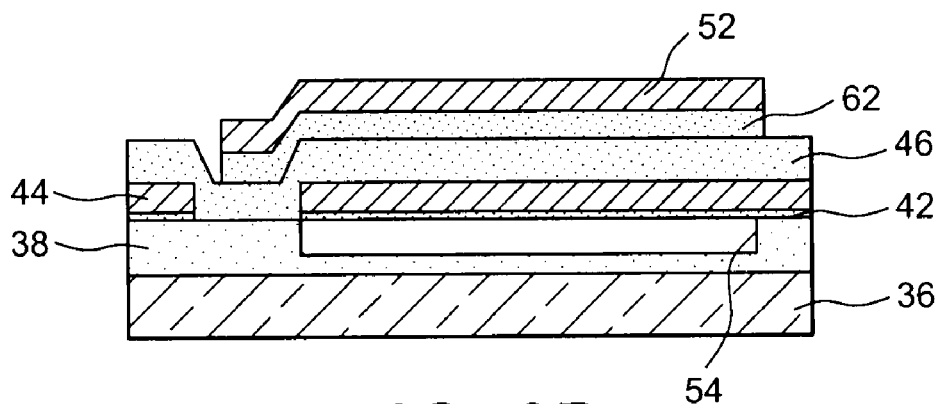

In a third example (FIG. 8A: top view; FIG. 8B: section AA of FIG. 8A), a $SiO_2$ layer 62, 200 nm thick, is added between the lower electrode 44 and the upper electrode 52. This layer 62 may be adjacent to the AlN layer 46, which is the case in FIG. 8. But it can also be in the AlN; in other words, this layer 62 may lie between two layers of AlN.

Silica ($SiO_2$) constitutes a recognised material as dielectric for electrets. This material is in fact capable of well conserving the electrical charges that have been injected therein.

In this respect, reference may be made to the article of P. Gunther, Charging, Long-term Stability, and TSD measurements of $SiO_2$ electrets, IEEE Transactions on electrical insulation, vol. 24, no 3, June 1989, and also to the article of V. Leonov et al., Stabilization of Positive Charge in $SiO_2/Si_3N_4$ Electrets, IMEC, IEEE Transactions on Dielectrics and Electrical Insulation, vol. 13, no 5, October 2006.

The production method is the same as for the first example, adding nevertheless a step of deposition of $SiO_2$ by PECVD, above the AlN layer, before the deposition of the upper electrode. The $SiO_2$ layer thus deposited will be etched with the same lithography as that which is used for the upper electrode, by dry etching by means of $CHF_3/O_2$ or by wet etching by means of HF. At the end of the method, the structure obtained is such as may be seen in FIGS. 8A and 8B.

The $SiO_2$ layer is thus above the AlN layer. But it is also possible to form the $SiO_2$ layer before the AlN layer.

The charging of the electret takes place in the same way as in the first and second examples.

Case of the First Example deposition of AlN,
deposition of the layer of dielectric, intended to become an electret layer,
charging by Corona discharge or by electron or ion implantation,
deposition of the upper electrode,
measuring the characteristic frequencies of the resonator.

The variation of the final frequency may then be made by heating of the structure because the temperature makes it possible to give mobility to the charges trapped in the electret.

The sequence of trimming of the frequency thus takes place in the following manner: measurement of the characteristic frequencies, comparison with the target frequency, heating (the annealing temperature depends on the dielectric but remains of the order of magnitude of a hundred or so degrees, or even a few hundreds of degrees), measurement of the characteristic frequencies, until the desired frequency is attained.

Case of the Second Example deposition of AlN,
deposition of the dielectric layer, intended to become an electret,
deposition of the upper electrode,
measurement of the characteristic frequencies of the resonator,
charging by electron or ion implantation of the dielectric layer; the charge is chosen so that the final direct voltage in the AlN is of the order of a hundred or so volts, given that the antiresonance frequency variation coefficient of AlN, as a function of the continuous electric field, is equal to 0.25 Hz·m/V according to the thesis of R. Lanz, mentioned above.

Another advantage of using silica to form the electret is that silica makes it possible to compensate the drift in temperature of the resonator comprising this electret.

It should be noted that materials other than $SiO_2$ may be used as electrets, particularly silicon nitride, PTFE and polymers.

A fourth example is given hereafter.

Figure 9:
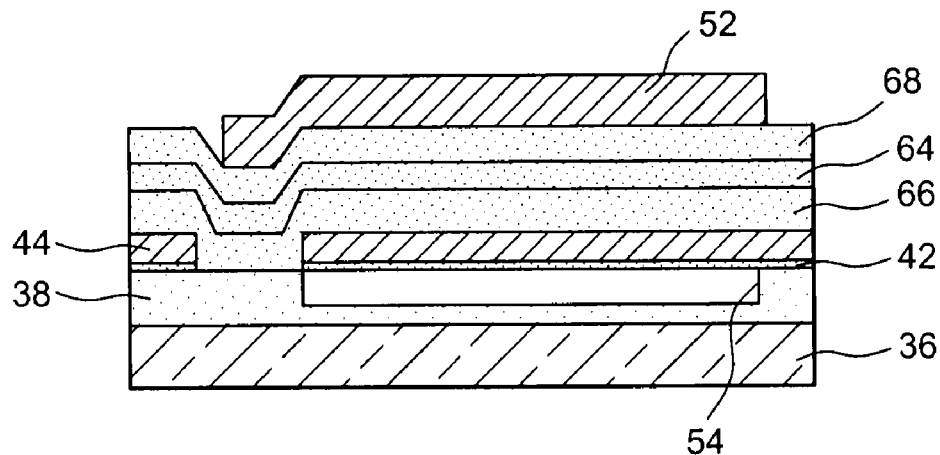

In the stack corresponding to this fourth example, the electret is placed in the piezoelectric material (see FIG. 9). The stack thus becomes: lower platinum electrode 44, 200 nm thick—piezoelectric AlN layer 66, 0.5 μm thick—$SiO_2$ layer 64, 200 nm thick—AlN layer 68, 0.5 μm thick—upper platinum electrode 52, 200 nm thick.

The advantage of such a stack compared to the previous one is that it makes it possible to move away the electrical charges stored in the electret from the electrodes. This enables the voltage that it is wished to apply to be increased, without breaking down the dielectrics. The electrical charging may take place in the same was as in the preceding examples: either just after the deposition of the dielectric intended to form the electret, or just after the deposition of AlN, or after the deposition of the upper electrode.

Figure 10A:
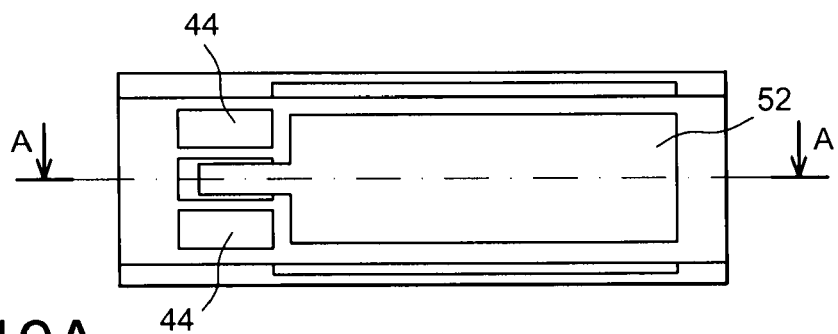

A fifth example will now be described, while referring to FIG. 10A (sectional view), and to FIG. 10B (section AA of FIG. 10A).

The four preceding examples were relative to FBAR, in other words resonators on a cavity.

It is also possible to form these resonators on acoustic Bragg gratings, also called acoustic Bragg mirrors.

Resonators have already been formed on such mirrors.

In this respect, reference may be made for example to the article of A. Volatier et al., Design, elaboration and characterization of coupled resonator filters for WCDMA applications, Ultrasonic symposium, Vancouver BC, 2006, pages 829-832.

The production is the same as previously, with the exception of the start and the final release, which is no longer necessary.

An acoustic Bragg mirror is firstly formed on the substrate 36. To do this, a tungsten layer 70, 670 nm thick, is deposited by cathodic sputtering on the substrate 36, then a $SiO_2$ layer 72, 800 nm thick, by PECVD, then once more a tungsten layer 74, 670 nm thick, then once more a $SiO_2$ layer 76, 800 nm thick.

The formation of the stack continues with the formation of the AlN seed layer 42, 20 nm thick.

And so on, as for the previous stacks.

Figure 10B:
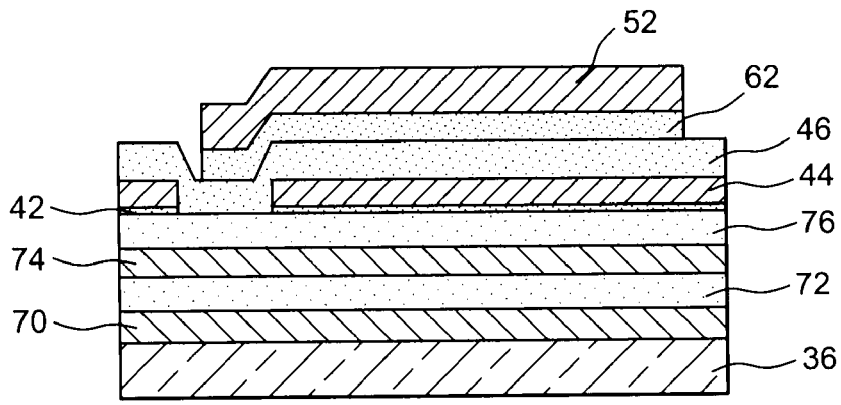

For the stack that can be seen in FIG. 10B, it is not necessary to release the resonator with $XeF_2$ because the Bragg mirror plays the role of acoustic insulation. The choice of the thicknesses of the layers constituting the mirror is known in the prior art. Reference may be made for example to the article of A. Volatier et al. mentioned above.

Obviously, this Bragg mirror may be "combined" with all the preceding examples: instead of being above a cavity, the resonators are above a Bragg mirror.

The charging of the dielectric ($SiO_2$) to form the electret takes place exactly as in the preceding examples. It is also possible to remove this dielectric and only conserve the AlN as electret, as in the first example.

The acoustic resonator, object of the invention, applies to switchable coupled resonator filters.

With regard to such filters, reference may be made to the patent FR 2 905 207, switchable resonator filters, invention of A. Volatier et al., or to the patent US 2008/129416 which corresponds to the patent FR 2 905 207. In such filters, two acoustic resonators are placed one over the other and acoustically coupled to each other (see the article of A. Volatier et al., Design, elaboration . . . applications, already cited above).

To implement the present invention, it is possible to then electrically charge the dielectric of the upper resonator or the dielectric of the lower resonator.

Figure 11:
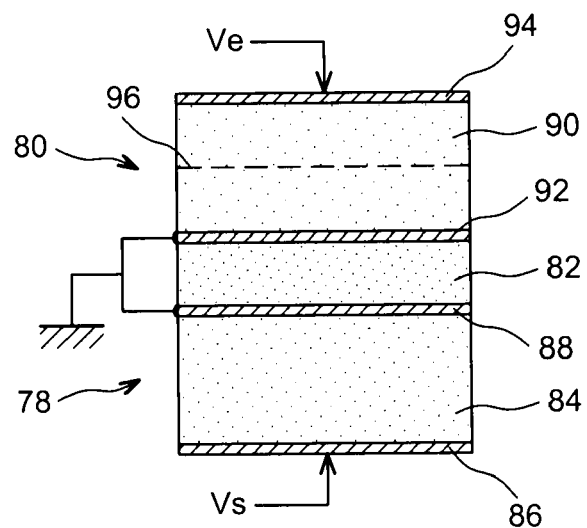
FIG. 11 is a schematic sectional view of a particular embodiment of the switchable coupled resonator filter, object of the invention, FIGS. 12, 13 and 14 schematically illustrate the principle of the damp electrode method, which can be used in the invention, FIGS. 15A and 15B schematically illustrate two electrical coupling topologies, used in BAW filters: ladder topology (FIG. 15A) and lattice topology (FIG. 15B), FIGS. 16A and 16B schematically illustrate the operating principle of a ladder filter, and FIGS. 17A and 17B schematically illustrate two acoustical coupling topologies, used in BAW filters.

FIG. 11 is a schematic sectional view of a switchable coupled resonator filter, according to the invention. The lower resonator 78, the upper resonator 80 and means 82 to acoustically couple these resonators to each other may be seen.

The resonator 78 comprises a layer of piezoelectric material 84 between two electrodes 86 and 88. In the same way, the resonator 80 comprises a layer of piezoelectric material 90 between two electrodes 92 and 94.

In the example, electrical charges 96 have been injected into the layer 90 which then serves both as resonant layer and electret. Obviously, a separate resonant layer and an electret layer in this resonator could be provided for, or any other variant of the invention.

For the use of the filter schematically represented in FIG. 11, the electrodes 88 and 92 are grounded, an input signal Ve is applied to the electrode 94 and an output signal V1 is recovered on the electrode 86.

The invention may also be used to apply a direct voltage to electrostrictive materials such as $(Ba,Sr)TiO_3$ (BST), $(Pb,La)(Zr,Ti)O_3$, $Pb(Mb,Nb,Ti)O_3$ in order to confer on them a permanent electric field.

An electrostrictive material for which a direct voltage is added to the excitation signal becomes induced piezoelectric (see for example the article of A. Volatier et al., Switchable and tunable strontium titanate electrostrictive bulk acoustic wave resonator integrated with a Bragg mirror, Applied Physics Letters, vol. 92, no 3, 2008, p. 032906-032909).

Applying electrical charges to such a material by the intermediary of an adjacent electret or even directly into the electrostrictive material then makes it possible to create resonators (or actuators) for which it is no longer necessary to apply a direct voltage in operation, on condition that the charges remain in the electret. In this way it is possible to form other resonators conforming to the invention, by taking all of the stacks described previously and replacing AlN therein by an electrostrictive material such as BST for example.

Corona discharge is returned to hereafter.

Corona discharge is generally used in photocopiers, for the production of ozone or instead to enhance the wettability of certain materials.

In the case of the present invention, its aim is to inject charges into a dielectric material which is capable of conserving them for a long period (typically several years): it involves an electret. The appearance of a surface potential and the creation of an electric field within the material ensues. It involves an electric dipole, in the same manner that a permanent magnet is a magnetic dipole.

In order to control the value of the permanent electric field, it is generally easier to control the surface potential of the sample. Indeed, thanks to the Corona triode system (point 6/grid 8/electrode 4—see FIG. 2), the surface potential of the sample 2 ($V_s$) takes the value of the potential imposed on the grid ($V_g$) and thus:

$$E = \frac{V_s}{d} = \frac{V_g}{d}$$

where $d$ is the thickness of the sample and $E$ the electric field.

The quantity of charges that are present in the material of the sample depends on the thickness of this material (d), its dielectric constant ($\in$) and the capacity of the material to conserve preferentially the charges at its surface, at depth, or, for multilayer systems, at the interfaces.

It is thus estimated that if a material conserves its charges (Q) at the surface (S), then the charge surface density ($\sigma$) is equal to:

$$\sigma = \frac{Q}{S} = \frac{\varepsilon \varepsilon_0 V_s}{d}$$

($\in_o$: vacuum permittivity).

In the case of a storage at depth, it is more difficult to determine the charge volume density ($\rho$) in the material.

A typical order of magnitude is a charge of 2 $mC/m^2$ which corresponds to a surface potential of 200 V over 500 nm of $SiO_2$.

The charging may be carried out under standard temperature and pressure conditions (20° C. at $10^5$ Pa); nevertheless, it is not excluded to carry it out under other conditions and particularly at higher temperatures or lower pressures and conversely. It is not excluded either to heat the sample during its charging, this generally having the effect of increasing the penetration depth of the charges in the material as well as increasing the stability.

The charging is generally carried out in ambient air ($O_2$: 20%, $N_2$: 80%). Nevertheless, it is not excluded to change these ratios, or even to change the gas.

The voltage of the point ($V_p$) is of the order of magnitude of a few kilovolts. The voltage of the grid ($V_g$) may vary between 0 V and 500 V. The two values may be positive (Corona+) or negative (Corona−). These voltages may, for example, be obtained by means of DC/HV converters.

Generally, the space between the point and the grid, just like the space between the grid and the sample, is of the order of 1 cm. The holes of the grid have, for their part, a millimetric size.

For the charging, another technique may be used, namely the damp electrode method (also called liquid electrode method), instead of Corona discharge.

Concerning this method, reference may be made to the article of K. Ikezaki et al., Thermally Stimulated Currents from Ion-Injected Teflon-FEP Film Electrets, Jpn. J. Appl. Phys. 20 (1981) pp. 1741-1747.

Figure 12:
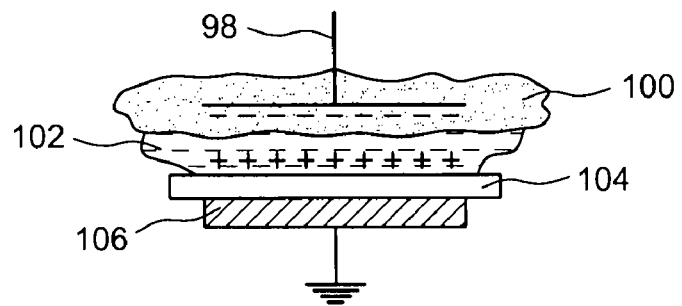
Figure 13:
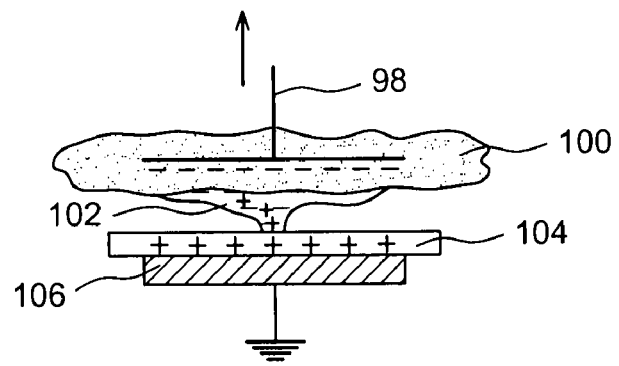
Figure 14:
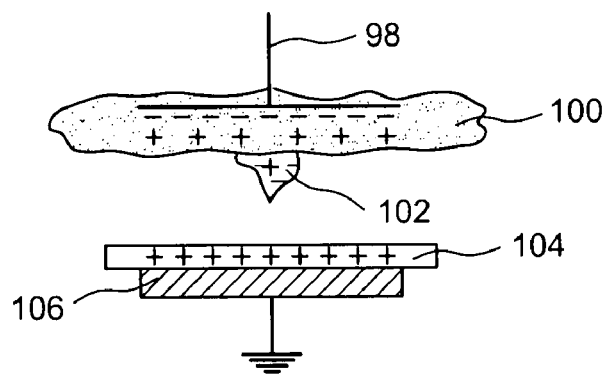

The principle of this method is schematically illustrated by FIGS. 12, 13 and 14.

In these figures, reference 98 designates an upper platinum electrode, reference 100 a cotton buffer, reference 102 an aqueous solution of electrolytes, reference 104 a layer constituting a sample, and reference 106 a lower electrode which bears the sample and which is grounded.

The upper electrode is negatively charged (by appropriate means, not represented) and surrounded by the buffer 100. And the upper electrode is located on the sample.

In a first step (FIG. 12), the upper electrode is approached towards the solution. The latter and the sample are then charged positively by influence.

In a second step (FIG. 13), the solution is absorbed by the buffer and the positive charges remain on the sample. The upper electrode provided with the buffer soaked with the solution is then moved away.

Once the upper electrode is retracted, a positively charged sample is obtained on the electrode 106 (FIG. 14).

Details on the Smart Cut™ method that may be used in the present invention to form the piezoelectric layer and/or the electret layer are given hereafter.

In order to form a thin film of monocrystalline material, resort may advantageously be made to two types of existing techniques for transferring thin films, making it possible to conserve the monocrystalline character: Smart Cut™ technology, based on the implantation of gaseous ions (typically hydrogen ions), and the bonding/thinning technique.

These techniques are unique techniques that make it possible to transfer a monocrystalline layer onto a host substrate. These techniques are perfectly controlled on silicon and enable among others the industrial production of SOI (for Silicon On Insulator) wafers.

These two techniques differ by the range of thicknesses of material that it is wished to transfer, the Smart Cut™ method enabling very low thicknesses, which can be typically less than around 0.5 μm, to be obtained.

The Smart Cut™ method (see the article of M. Bruel, Silicon on insulator material technology, Electronic letters, 31 (14), p. 1201-1202, 1995), enables the production of SOI substrates, comprising silicon on an insulator.

Smart Cut™ technology may be schematically resumed by the following four essential steps:

Step 1: Hydrogen implantation is carried out on an oxidised Si substrate A. The oxide layer then constitutes the future buried insulator film of the SOI structure. This implantation step generates the formation of a fragilised zone at depth, which is constituted of microcavities, the growth of which is the basis of the detachment phenomenon.

Step 2: Bonding by molecular adhesion makes it possible to join the implanted wafer A to the support wafer (counterplate or base) B which is not necessarily oxidised. A surface preparation is necessary to obtain good quality bonding.

Step 3: The fracture step is carried out at the fragilised zone by means of a thermal treatment in the range 400° C.-600° C. On the one hand, the SOI structure is obtained and, on the other hand, the substrate initially implanted A, peeled from the transferred layer. The latter may then be recycled to carry out another transfer.

Step 4: Final treatments consist, on the one hand, in an annealing at high temperature to consolidate the bonding interface between the thin film transferred and the support substrate and, on the other hand, a polishing which makes it possible to obtain the desired final thickness of superficial silicon film, as well as a good surface condition.

The thickness of the transferred layer is directly linked to the implantation energy of the ion beam, and therefore makes it possible to obtain a good flexibility with regard to thick combinations (thin film and buried oxide). By way of example, the thickness of silicon transferred may range from a few tens of nanometers to around 2 μm by using a conventional implanter (energy less than 210 keV).

The layers transferred are uniform and homogeneous in thickness because they are defined by an implantation depth and not by a mechanical thinning.

The production costs are reduced, on the one hand, by the recycling of the substrates (the wafers initially implanted may be reused after transfer of the thin film), and on the other hand by the use of standard equipment in microelectronics.

It is a flexible method that enables for example heterostructures to be formed. Thus, Smart Cut™ technology makes it possible for example to couple the advantages of a support substrate made of bulk Si (particularly cost, weight and mechanical characteristics) and an active thin film. In this way it is possible to carry out the transfer of layers of different materials such as:

SiC—see L. DiCioccio et al., "Silicon carbide on insulator formation by Smart Cut™ process", Master, Sci. Eng. vol. B46, pp. 349-356 (1997);

GaAs—see E. Jalaguier et al., "Transfer on thin GaAs film on silicon substrate by proton implantation process", Electronic letters, vol. 34, no 4, pp. 408-409 (1998);

InP—see E. Jalaguier et al., "Transfer of thin InP film onto silicon substrate by proton implantation process", IEEE Proc. 11th International Conference on Indium Phosphide and Related Materials, Davos (Switzerland) (1999);

GaN—see A. Tauzin et al., "Transfers of 2-inch GaN films onto sapphire substrates using Smart Cut™ technology", Electronics Letters 2005, vol. 41, No 11;

or Ga—see C. Deguet et al. —"200 mm Germanium-On-Insulator (GeOI) structures realized from epitaxial Germanium wafers by the Smart Cut™ technology", Electro Chemical Society 2005.

These transfers may be carried out on different substrates, particularly quartz, Si, Ge, GaAs and sapphire.

The Bragg mirror is now returned to.

One solution for insulating the BAW (for Bulk Acoustic Wave) type acoustic resonator from the substrate is based on a principle very widely used in optics: the Bragg mirror.

Its acoustic transposition consists in forming under the resonator a stack in which quarter wave layers of materials with low acoustic impedance alternate with quarter wave layers of materials with high acoustic impedance. In this configuration, the resonators are also known as SMR (for Solidly Mounted Resonator).

This idea, first proposed in 1965—see the article of W. E. Newell, Face-mounted piezoelectric resonators, Proc. of IEEE, pp. 575-581, 1965—for quartz resonators, has been taken up in the BAW SMR resonators made by K. M. Lakin et al., Development of miniature filters for wireless applications, IEEE Trans. Microwave Theory. Tech., vol. 43, no 12, pp. 2933-2939, 1995.

In the case of the Bragg mirror, the reflection coefficient depends on the materials and the number of layers used and is not constant over the whole frequency band. The key parameters and the characteristics of the response of a Bragg mirror will therefore be made clear.

It is possible to calculate the reflection coefficient that a Bragg mirror has for a longitudinal wave using a transmission line type model—see the article of K. M. Lakin, Fundamental properties of thin film resonators, IEEE Freq. Contr. Symp., pp. 201-206, 1991. This model makes it possible to represent the acoustic impedance $Z_n$ presented by a layer as a function of the acoustic impedance of the lower layer $Z_{n-1}$ by the expression:

$$Z_n = Z_{mat} \cdot \left( \frac{Z_{n-1} \cdot \cos(\theta_{mat}) + i \cdot Z_{mat} \cdot \sin(\theta_{mat})}{Z_{mat} \cdot \cos(\theta_{mat}) + i \cdot Z_{n-1} \cdot \sin(\theta_{mat})} \right),$$

where $$\theta_{mat} = \frac{\omega \cdot e_{mat}}{V_{mat}}$$

is the pulsation and $Z_{mat}$, $e_{mat}$ and $V_{mat}$ are respectively the acoustic impedance, thickness and velocity of the longitudinal wave of the layer.

From this expression, it is possible to determine the impedance $Z_{Bragg}$ presented by the Bragg mirror at the interface between the lower electrode and the Bragg mirror. The reflection coefficient R for the longitudinal wave is expressed:

$$R = \frac{Z_{elec} - Z_{Bragg}}{Z_{elec} + Z_{Bragg}},$$

where $Z_{elec}$ represents the acoustic impedance of the lower electrode.

The reflection coefficient presented by the Bragg mirror is a function of the number of layers. The couple of materials $SiO_2/W$ is commonly used because it makes it possible, from four layers, to fulfil the function of acoustic insulation.

The number of layers required increases when materials that have a lower ratio of acoustic impedances are used. Thus, in the case of the couple $SiO_2/AlN$, which was one of the first to be exploited, two layers are necessary to attain a sufficient reflection—see the article of M. A. Dubois, Aluminium nitride and lead zirconate-titanate thin films for ultrasonics applications: integration, properties and devices, Thesis of the EPFL, 1999.

The ratio of the acoustic impedances also defines the width of the reflection pass band of the Bragg mirror. The higher the ratio of the acoustic impedances, the wider the range of frequencies over which the Bragg mirror has a good reflection. Thus, this reflection band for a mirror with six layers attains 1.5 GHz for the couple $SiO_2/AlN$ and 2.8 GHz for the couple $SiO_2/W$.

The couple $SiO_2/W$ thus has the advantage of using few layers and having a very wide range of reflection. On the other hand, its integration in BAW filters requires etching the tungsten outside of the active zones in order to avoid parasitic capacitive couplings.

Information on different types of filters is given hereafter. This information is useful, in the present invention, because it is possible to improve the response of filters with electrets particularly by improving the insertion losses.

Two types of topologies, based on the electrical coupling of resonators, may be used for the production of BAW type radiofrequency pass band filters: ladder topology and lattice topology.

Figure 15A:
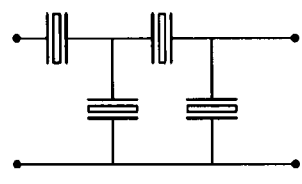
Figure 15B:
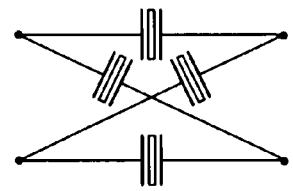

The lattice filter represented in FIG. 15B was first developed in 1929 by W. P. Watson. It is particularly used for its good performances in terms of out-of-band attenuation despite a low selectivity. Its symmetry properties moreover make it a filter well adapted for differential architectures.

The ladder topology (see FIG. 15A) was proposed by L. Espenchied in 1927. Unlike the lattice filter, this type of filter has a very good selectivity but a mediocre out-of-band rejection level.

To produce these two filters, it is necessary to have two types of resonators having different frequencies. The frequency shift may be obtained from a standard resonator, by adding an additional layer to lower the frequency ($SiO_2$ for example), or by etching the upper layer to increase the frequency.

This frequency shift is a very sensitive point in the production of these filters because it plays to the first order on the width of the pass band as well as on the level of insertion losses.

Figure 16A:
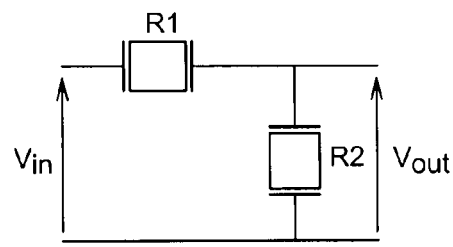
Figure 16B:
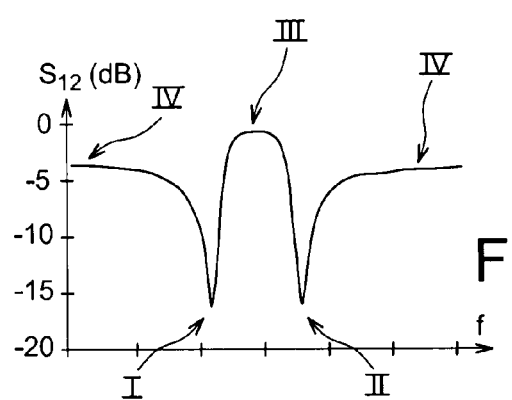

FIG. 16A shows a base cell of this type of filter (Vin: input voltage; Vout: output voltage). Given the lay out of the resonators, the antiresonance frequency of the resonator "in parallel" R2 must be shifted to coincide with the resonance frequency of the resonator "in series" R1. Reference is made to FIG. 16B where the parameter $S_{12}$ (in dB) is represented as a function of the frequency f (arbitrary units). Zone I corresponds to the resonance of R2, zone II to the antiresonance of R1, zone III to the resonance of R1 and to the antiresonance of R2, and zones IV to none of the resonances and thus simply to the bridge of the two capacitances.

In this type of very simplified architecture, the influence of the performances of the resonator is once again found. The pass band width is directly linked to the electromechanical coupling coefficient $k_1^2$. The level of insertion losses is linked to the losses in the resonators and thus to the quality factor. Finally, the quality factor is also going to influence the selectivity of the filter.

One of the advantages of these filters is the relative simplicity of production since it suffices to use a single additional layer compared to the production of a resonator to be able to form even a complex filter.

Furthermore, these two architectures, with their complementary properties, give a good flexibility in terms of design. Recently, works have moreover come to light on the use of mixed ladder/lattice architectures, making it possible to combine both the advantages of good out-of-band rejection and good selectivity (see A. Shirakawa et al., *A high isolation and high selectivity Ladder-Lattice BAW BAW-SMR filter*, IEEE Eur. Microwave Conf., pp. 905-908, 2006).

On the other hand, these filters, like SAW electrical coupling filters, cannot be totally asymmetrical or differential. Furthermore, they do not enable impedance transformation to be performed. When these conversions are required for the RF architecture, it is thus necessary to add "BalUn" (for Balanced/Unbalanced) type components, which are bulky and which increase the losses.

SCF type (for Stacked Crystal Filter) and CRF type (for Coupled Resonator Filter) acoustic coupling filters, which are made use of in BAW filters, will now be considered.

These components are presented hereafter in a succinct manner.

Figure 17A:
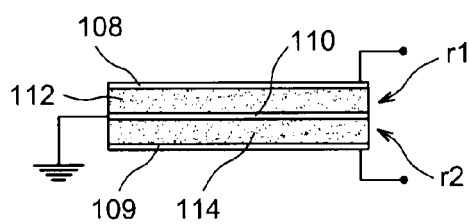

The first works concerning acoustic coupling filters in thickness mode are due to A. Ballato and T. Lukaszek in 1972 and 1973. Their device, which consisted in bonding two quartz resonators r1 and r2 (see FIG. 17A where references 108 and 109 designate electrodes, reference 110 an earth plane and references 112 and 114 piezoelectric layers) was taken up again in 1987, benefiting from microelectronic techniques to resolve the problems of bonding (see G. R. Kline et al., *Low insertion loss filters synthetized with thin film resonators*, IEEE Ultrason. Symp., 1987).

SAW DMS technology makes it possible to combine both the filtering function and the mode and impedance conversion functions. This advantage, coupled with the progress made in SAW technology in terms of encapsulation and power handling, today makes these filters components that cannot be ignored in the radiofrequency filter market. To impose itself, BAW technology, which requires more production steps, must also offer these properties of mode conversion and impedance transformation.

Figure 17B:
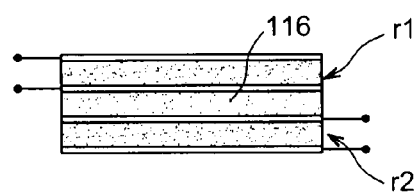

A component has been proposed (see U.S. Pat. No. 6,720,844) to meet these requirements (see FIG. 17B). It is based on the concept of the SCF (for Stacked Crystal Filter); one or more insulating coupling layers 116 are inserted between the two resonators r1 and r2. This has the advantage, on the one hand, of widening the pass band of the filter and, on the other hand, electrically insulating the electrical input from the output. This component is noted CRF (for Coupled Resonator Filter).

This component makes it possible to obtain more compact and more complete filters (see US 2005/0206476, U.S. Pat. No. 6,917,261 and WO 2005/046052). On the other hand, unlike acoustic coupling SAW filters, where the coupling of the wave takes place in the plane of the substrate, the production of a CRF filter turns out to be complex because it requires the stacking of two BAW resonators.

Furthermore, one of the conditions that cannot be ignored for the correct operation of this filter is the trimming, to near to a few MHz, of the resonance frequencies of the two resonators. This may explain why, despite the very abundant literature in the field of BAW resonators and filters, only two functional realisations of CRF filters have been presented to date (see K. M. Lakin, *Coupled Resonator Filter*, IEEE Ultrason. Symp., pp. 901-908, 2002, and G. G. Fattinger et al., *Coupled bulk acoustic wave resonator filters: Key technology for single-to-balanced RF filters*, IEEE MTT-S Digest, pp. 927-929, 2004).

It is recalled that in a resonator according to the invention, the intensity of the electric field generated by the electret is determined to shift the resonance frequency of the resonator by a desired value. And it is pointed out that this electret may be an electret made of polymer material but that it is preferably an electret made of mineral material, for example $SiO_2$, $SiN$, $Al_2O_3$, or $SrTiO_3$: an electret made of mineral material has the advantage of being much more rigid than an electret made of polymer material.

The invention claimed is:

1. Acoustic resonator, comprising:
   at least one piezoelectric layer,
   first and second electrodes on either side of the piezoelectric layer, and
   at least one electret layer between the first and second electrodes, to apply a permanent electric field to the piezoelectric layer,
   wherein the intensity of this electric field is determined to shift the resonance frequency of the resonator by a desired value.

2. Acoustic resonator according to claim 1, in which, the piezoelectric layer or layers having respectively electromechanical properties, said electret layer comprises permanent electrical charges, making it possible to modify said electromechanical properties.

3. Acoustic resonator according to claim 1, in which the electret layer is made of piezoelectric material.

4. Acoustic resonator according to claim 1, in which the thickness of the electret layer is chosen from a few nanometers to a few tens of micrometers.

5. Acoustic resonator according to claim 1, further comprising a substrate on one face of which is arranged one of the electrodes.

6. Acoustic resonator according to claim 1, in which the piezoelectric layer contains electrical charges to constitute itself the electret layer.

7. Acoustic resonator according to claim 1, in which the electret layer is separate from the piezoelectric layer or layers.

8. Acoustic resonator according to claim 7, in which the electret layer lies between the piezoelectric layer and one of the first and second electrodes.

9. Acoustic resonator according to claim 7, comprising first and second piezoelectric layers and in which the electret layer lies between the first and second piezoelectric layers.

10. Acoustic resonator according to anyone of claims 5 to 7, further comprising a substrate on one face of which is arranged one of the electrodes, in which the substrate is provided with a cavity, or hole, which opens up onto at least one face of the substrate, and in which one of the first and second electrodes lies on this face of the substrate, above the cavity.

11. Acoustic resonator according to any of claims 5 to 7, further comprising a substrate on one face of which is arranged one of the electrodes, this acoustic resonator moreover comprising an acoustic Bragg grating arranged between the substrate and one of the first and second electrodes.

12. Acoustic resonator according to claim 1, in which the electret layer is crystalline.

13. Acoustic resonator according to claim 1, in which the electret layer is amorphous.

14. Acoustic resonator according to claim 1, in which the electret layer is made of a mineral material.

15. Switchable coupled resonator filter, comprising acoustic resonators which are acoustically coupled to each other and in which at least one of the acoustic resonators according to claim 1.

* * * * *